July 22, 1969 L. H. LAWRENCE 3,457,469

NOISE DIODE HAVING AN ALLOY ZENER JUNCTION

Filed Nov. 15, 1965

INVENTOR.
Lamonte H. Lawrence
BY
Mueller, Aichele & Rauner
ATTYS.

United States Patent Office
3,457,469
Patented July 22, 1969

3,457,469

NOISE DIODE HAVING AN ALLOY ZENER JUNCTION

Lamonte H. Lawrence, Tempe, Ariz., assignor to Motorola, Inc., Franklin Park, Ill., a corporation of Illinois Filed Nov. 15, 1965, Ser. No. 507,879
Int. Cl. H01l 11/04
U.S. Cl. 317—234 13 Claims

ABSTRACT OF THE DISCLOSURE

A noise diode and process for fabricating same which includes initially forming a diffused PN junction in a semiconductor body and thereafter forming an alloy PN junction which extends beneath the diffused junction and into the semiconductor body. The alloy junction is a step junction having a breakdown voltage of less than that of the diffused junction so that Zener breakdown occurs in the bulk of the body. Immediately after forming the alloy junction, the semiconductor body is rapidly cooled at a rate sufficient to prevent annealing and to produce a lattice strain therein. Such lattice strain is due in part to the differences in temperature coefficients of expansion of the semiconductor body and of the alloyed region therein. When the diode is biased to its avalanche breakdown region, white noise is produced as a result of such lattice strain.

This invention relates to semiconductor devices and more particularly to a Zener diode capable of producing noise uniformly over the avalanche region and to the fabrication of such a diode.

Zener diodes are widely used as a convenient means of voltage regulation. As is desirable with most circuit components, the noise level of Zener diodes has been constantly reduced to what is now a very low level. This low noise level is the result of extensive research and careful attention to the manufacturing techniques utilized.

In some applications, however, it is preferred to introduce a known or identifiable noise signal in combination with the signal to be transmitted. This identifiable noise signal may be introduced during the initial transmission or at some later time. Upon receipt of the combined signal, the noise can be removed or identified and the primary message isolated. This technique is often utilized for classified communications coding applications and some forms of proximity fuses.

To be satisfactory for this type of application, the noise producing device must have controllable parameters so that the noise signal may be identified. A substantial fluctuation of these parameters could introduce errors which affect critical communications during actual operations.

Noise diodes generally have been formed by a process involving two diffusions. The two diffusions are very similar, usually, as to the dopant and temperature. However, the diffusion time of the first diffusion is substantially longer than that of the second diffusion and after completion of the first diffusion the wafers are rapidly cooled. After the second diffusion, the wafers are slowly cooled, producing an annealing effect to relieve crystal strain.

A noise diode fabricated in this manner is believed to function with a "forced early" breakdown. This breakdown condition is believed to occur at the surface of the semiconductor material where the junction terminates. As with most surface type conditions, there are many inherent variables operating to alter the parameters of such a device. Because of lack of control of the parameters, this type of device is not fully satisfactory for many applications.

An object of this invention is to provide a Zener diode capable of producing noise uniformly over the avalanche region with controllable parameters.

Another object of this invention is to provide a Zener diode capable of producing noise uniformly over the avalanche region and a Zener breakdown that occurs within the bulk of the semiconductor material.

A further object of the invention is to provide a process for fabricating a Zener diode capable of producing noise utilizing an alloying process.

Another object of the invention is to provide a process for fabricating a Zener diode capable of producing uniform noise which process yields devices having controllable and reproducible parameters.

A feature of this invention is a novel alloyed Zener diode capable of producing noise uniformly over the avalanche region having lattice strain in the region related to the active PN junction because of a mismatch of coefficients of thermal expansion of the alloy and the semiconductor material.

Another feature of this invention is a Zener diode having an alloyed PN junction surrounded by a graded PN junction wherein the device parameter determining area is limited to the stressed alloyed region PN junction.

A further feature of the invention is the fabricating of a Zener diode capable of producing noise by an alloying process, wherein the alloying is performed at an elevated temperature for a preselected period of time.

Another feature of the invention is the rapid cooling of the device after the alloying process which is believed to establish lattice strain in the semiconductor material causing the desired noise.

The present invention is embodied in a semiconductor active element for use as a Zener diode capable of producing noise uniformly over the avalanche region. This element includes a first and second region of one conductivity type on one side of the element and a third region of opposite conductivity type forming an abrupt PN junction with the first region. The first region has a strained lattice structure and a coefficient of thermal expansion different from the second and third region. The third region also forms a graded PN junction with the second region. This graded PN junction extends to the surface of the element on the one side and is covered with a dielectric material. This graded PN junction also has a higher Zener breakdown voltage than the abrupt PN junction. Connection means are applied to the first and the third region.

The invention is also embodied in a process for fabricating the active element for a semiconductor diode device having a Zener type breakdown capable of producing noise uniformly over the avalanche region. A region of a conductivity type different from the element is formed on one side of a semiconductor element and a metal is deposited on the same side of the same conductivity type as the region and within its perimeter. The alloy of the metal and the element has a coefficient of thermal expansion different from the element. The element is heated to form an alloy of the metal and element within the perimeter and extending through the previously mentioned region. This forms a PN alloy type junction between the alloy and the element. Thereafter, the element is quenched immediately upon the formation of the alloy. Finally, a contacting metal is deposited on a portion of said element of different conductivity type from said region.

Figure 1:
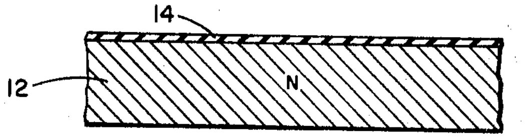
FIGS. 1–6 are cross-sectional views of a semiconductor wafer representing progressive stages in the formation of a Zener diode capable of producing noise according to the invention.
Figure 2:
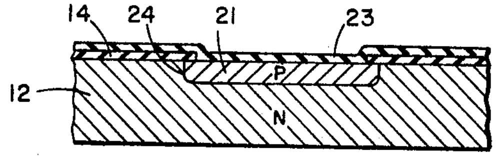

In one embodiment of the invention, as shown in the drawing, a semiconductor wafer 12 of N type silicon has an oxide 14 grown on its surface (FIG. 1). In FIG. 2 wafer 12 is shown after a portion of oxide 14 has been removed and a shallow P type region 21 forming a PN junction 24 with wafer 12 formed therein. During this diffusion an oxide layer 23 has been grown over the exposed surface of wafer 12.

Figure 3:
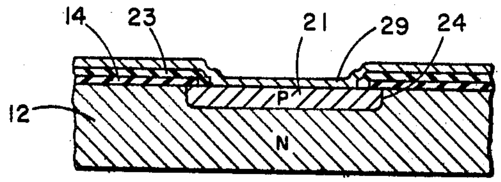
Figure 4:
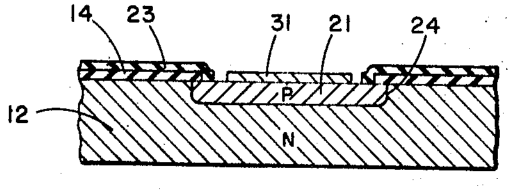
Figure 5:
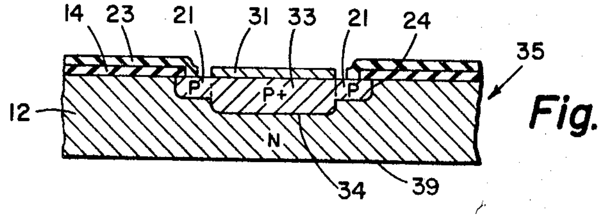
Figure 6:
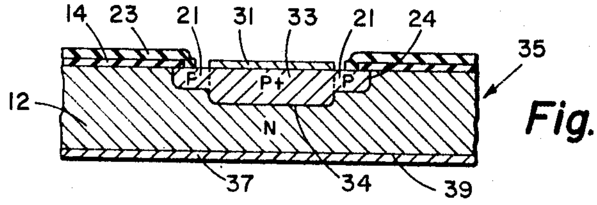

In FIG. 3, aluminum 29, a P type dopant, has been deposited on oxide 23 and the surface of region 21 after a portion of oxide layer 23 had been removed. Aluminum 29 is patterned to form a dot 31, FIG. 4, within the perimeter of region 21. Dot 31 is alloyed, FIG. 5, with the silicon material to form an alloy region 33 surrounded by region 21 and extending therethrough to form an abrupt PN junction 34 with N type wafer 12. In FIG. 6 a solderable ohmic contact 37 has been formed on surface 39 to complete the formation of an active element 35 or Zener diode ready for encapsulation.

Figure 7:
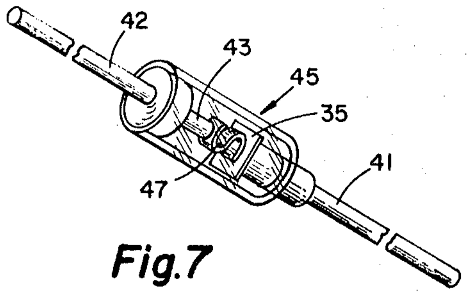
FIG. 7 is an enlarged perspective view of an assembled device.

Normally it is desirable to encapsulate the element in a package which will protect the element from the surrounding ambient. To provide this protection element 35 is soldered to a nail head lead 41, FIG. 7, which is sealed in an open end glass package 43. A lead 42 with an S bend 47 is inserted in the open end of glass package 43 so that S band 47 presses against aluminum region 31 with spring tension. Glass package 43 is sealed around lead 42 to form a hermetically sealed package 45.

Figure 8:
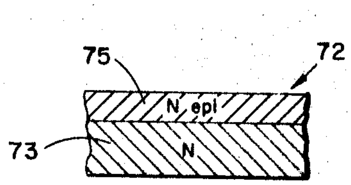
FIG. 8 is a cross-sectional view of a starting element for another embodiment of this invention.

In another embodiment of the invention, FIG. 8, a wafer 72 which may be used as a starting material in the formation of the Zener diode is shown. Wafer 72 includes a semiconductor substrate 73 and a parameter determining epitaxially grown layer 75.

The active element of the Zener diode is generally fabricated from a single crystal semiconductor material. During the growing of this crystal by well known techniques a selected impurity or dopant is added to the semiconductor material to yield the desired conductivity type. This crystal is sawed into thin sections, commonly called wafers, which are lapped, polished and otherwise processed to obtain the desired surface and thickness. By controlling the crystal orientation during the crystal growing and sawing, a selected crystal orientation is obtained. A 111 crystal orientation is particularly advantageous.

Generally, the wafer described above will form the starting material for the semiconductor device. This wafer forms one of the two voltage determining regions or layers, the adjacent regions forming the active PN junction. By varying the impurity concentration, which changes the resistivity, of these regions, it is possible to adjust the breakdown voltage of the device over a wide range from a few to several hundred volts. If the wafer includes an epitaxially grown layer on which the fabrication process is performed, the epitaxial layer becomes one of the voltage determining layers.

Different configurations may be used in the fabrication of the active areas of the device. Preferably these are basic configurations, such as squares or circles, which are easily formed using known photoresist processing.

In photoresist processing a thin layer of a photosensitive etch resistant material is deposited on the surface of the material to be shaped. A patterned mask is placed over the wafer and aligned to a desired orientation thereto. The photo-sensitive material is exposed to light through the mask and the resulting chemical reaction hardens the exposed portions. The photo-sensitive material is washed with a solvent, dissolving the unexposed portions and leaving the desired pattern on the wafer surface. Utilizing a suitable etchant with this process, it is possible to quickly form closely controlled exposed areas on the semiconductor material to be processed.

To achieve a stable device, it is generally desirable to have the breakdown occur within the bulk of the material. In a Zener diode device the reverse voltage at which this occurs in the Zener breakdown voltage $V_z$ or the avalanche region. At this voltage, $V_z$, the Zener diode suddenly changes from a current blocking state to a highly conductive state. This breakdown may occur at the surface of the device where the junction terminates or within the bulk of the device. The latter situation is preferred because once the device parameters are established it is probable that they will remain the same under normal operating conditions. Bulk breakdown may be obtained by forming a continuous PN junction wherein the junction region at the surface of the material forms a PN junction having a higher breakdown voltage than the PN junction within the bulk of the material. A diffused region and an alloyed region of the same conductivity type may be combined to obtain the above configuration. A narrow region of opposite conductivity type is formed by a solid state diffusion on one side of a semiconductor water. A metal-semiconductor alloy is formed within the perimeter of the diffused region using a metal having the same conductivity type as the diffused region. This alloy extends through the diffused region, forming a PN junction with the bulk of the semiconductor wafer. A continuous PN junction is thusly formed with the portion having the lower breakdown voltage limited to the bulk of the material by the surrounding portion having a higher breakdown voltage. The later portion being a low reverse current leakage junction which is protected at its termination at the surface of the semiconductor material by a high dielectric material. The differences of the breakdown characteristics of graded junctions and alloy step junctions are well known in the semiconductor art.

An alloy is generally a homogenous mixture of two metals. To form this mixture, the two metals are heated sufficiently to form a solution thereof. This solution when cooled will generally have physical properties, such as melting point and coefficient of thermal expansion, which are different from the pure metals. The fabrication of a Zener diode to produce noise according to the invention takes advantage of these differences in physical properties. It is believed that rapid cooling or quenching of the material, after the formation of the alloy induces lattice strain when the alloy has a different coefficient of thermal expansion than the pure metals. Quenching prevents the crystal from adjusting, as it would if slowly cooled, for this difference in the two materials.

The difference in coefficient of thermal expansion of silicon and an aluminum-silicon alloy is one example of the above. The coefficient of thermal expansion of the aluminum-silicon alloy is about $3.3\times10^{-6}$ per ° C. This difference in coefficient of thermal expansion results in a sizable dimensional variation between these materials when they are cooled substantially instantaneously from between about 900° and 1100° C. to about 27° C. As mentioned above, it is believed that a rapid quenching, which prevents annealing, results in lattice strain. This theory is believed to provide a valid explanation of the capability of consistently reproducing selected parameters of noise in a Zener diode device.

Typical parameters of Zener diode devices capable of producing noise uniformly over the avalanche region fabricated according to the invention with silicon wafers having a resistivity between about .09 and .11 ohm-cm. as the starting material are a Zener breakdown voltage, $V_Z$, between about 13.5 and 19 volts at 100 microamperes, a reverse leakage at 12 volts of less than ½ microampere and noise, commonly referred to as "white noise," of a minimum of 60 millivolts RMS (root mean square) for frequencies in excess of 60 kilocycles from between about 3 and 48 microamperes. In the following explanation, the fabrication of an active element for this device is more specifically described.

The active element described above may be fabricated by exposing a wafer of N type silicon about 8 mils thick on which a plurality of active elements may be formed to an oxidizing ambient of steam at between about 900 and 1300° C. It is to be understood that this wafer may be formed from the other well known semiconductor materials. Openings are etched in the oxide and a P type diffusion performed at a temperature between about 700° and 1300° C. with a gaseous mixture including boron as a dopant and nitrogen. This diffused P type region spreads laterally so that it forms a PN junction under the oxide formed above. A P type metal, in this example aluminum, is deposited on the surface of the P type region. Although boron and aluminum are used in this example, many other P and N type dopants are well known which may be used depending upon the starting material and the processing steps utilized. The wafer is placed on a graphite resistance heater and rapidly heated to a temperature between about 900° and 1100° C. to form an aluminum-silicon alloy. A temperature of about 1025° C. has been found preferable for this alloying process.

Immediately upon the formation of the aluminum-silicon alloy the wafer is placed upon a glass tray maintained at room temperature. In this manner the wafer is quenched to room temperature in a few seconds. This alloying operation generally requires less than 15 seconds from the time the wafter is placed on the heater and the time it again reaches room temperature. An alloy region formed according to this process extends vertically through the P type region into the wafer but does not extend laterally beyond the P region. The active element may then be encapsulated in glass, plastic or metal package depending upon the final application requirements.

The above description and drawings show that the present invention provides a novel Zener diode capable of producing noise uniformly over the avalanche region and a novel process for fabricating the same. Furthermore, the parameters of this device are controllable and the Zener breakdown occurs within the bulk of the material. Moreover, an improved device is formed with a process for fabricating a Zener diode utilizing an alloying process and resulting in controllable and reproducible parameters.

I claim:

1. A semiconductor active element for use as a Zener diode capable of producing noise uniformly over the avalanche region, said element including first and second regions of one conductivity type on one side of said element, a third region of opposite conductivity type forming an abrupt PN junction with said first region, and a graded PN junction with said second region, said first region having a strained lattice structure and a coefficient of thermal expansion different from said second and third regions, said graded PN junction extending to the surface of said one side of said element, dielectric material over said graded PN junction at the surface of said one side, said graded PN junction having a higher Zener breakdown voltage than said abrupt PN junction, connection means to said first region and connection means to said third region.

2. A semiconductor active element according to claim 1 in which said element is silicon.

3. A semiconductor active element according to claim 2 in which said first region comprises an aluminum-silicon alloy.

4. In the manufacture of a semiconductor diode device having a Zener type breakdown capable of producing noise uniformly over the avalanche region, the process of fabricating an active element for said device including the steps of forming on one side of a semiconductor element a region of a conductivity type different from said element, depositing a metal on said one side within the perimeter of said region and of the same conductivity type as said region, heating said element to form an alloy of said metal and element within the perimeter of and extending through said region to form a PN alloy type step junction between said alloy and said element, said alloy having a coefficient of thermal expansion different from said element, quenching said element immediately upon the formation of said alloy by rapidly cooling said element at room temperature immediately subsequent to heating to thereby prevent annealing in said element and produce lattice strain in the region of the element adjacent said PN alloy type step junction, and forming connector means on a portion of said element of a different conductivity type from said region.

5. A process according to claim 4 in which said region is formed by a solid state diffusion.

6. A process according to claim 4 in which said element is silicon.

7. A process according to claim 4 in which said metal is aluminum.

8. A process according to claim 4 in which a side opposite said one side is bonded to a metallic lead and encapsulated in a hermetically sealed package with a second lead contacting said metal and extending from said package.

9. A process according to claim 4 in which a dielectric is deposited over said region and semiconductor element on said one side.

10. A process for fabricating a Zener diode capable of producing noise uniformly over the diode avalanche region including the step of: forming a first region of one conductivity type in a semiconductor body of opposite conductivity type semiconductor material to thereby form a PN junction, alloying a metal through said one region to thereby form a second, alloy region in said semiconductor body of said one conductivity type and extending said PN junction into said body beneath said first region, said second, alloy region having a coefficient of thermal expansion different from that of said first region and of said semiconductor body, and rapidly cooling said semiconductor body subsequent to alloying said second region therein at a rate sufficient to prevent annealing in said semiconductor body and to produce a lattice strain therein, said lattice strain causing noise to be produced in said semiconductor body when the Zener diode is biased to its avalanche breakdown region.

11. The process for fabricating a Zener diode according to claim 10 wherein the forming of said first region is carried out by diffusing an impurity said one conductivity type into said body of opposite conductivity type semiconductive material, said alloying said metal through said first region being carried out by initially depositing said metal on said first region and thereafter heating said semiconductor body at elevated temperatures to cause said metal to alloy through said first region and to form said alloy region, said lattice strain in said alloy region caused by the combination of said rapid cooling and the mismatch of coefficients of thermal expansion of the alloy region and the remainder of the semiconductor body.

12. The process defined in claim 11 wherein said alloying is performed by heating said body between temperatures ranging from 900° C. to 1100° C. to form an aluminum-silicon alloy region, and said rapid cooling of said semiconductor body consisting of removing the heated semiconductor body to a location at room temperature in the order of 27° C. to thereby cause the rapid cooling to occur.

13. The process defined in claim 12 wherein said alloying is performed by heating said semiconductor body at approximately 1025° C. for less than approximately 15 seconds.

References Cited

UNITED STATES PATENTS

| | | | |
|---|---|---|---|
| 3,154,692 | 10/1964 | Shockley. | |
| 3,293,010 | 12/1966 | Hackley. | |
| 3,341,380 | 9/1967 | Mets et al. | |
| 3,332,143 | 7/1967 | Gentry. | |
| 3,349,298 | 10/1967 | Shockley | 317—234 |
| 3,354,003 | 11/1967 | Langridge. | |

FOREIGN PATENTS

| | | |
|---|---|---|
| 1,372,145 | 8/1964 | France. |

OTHER REFERENCES

IBM Technical Disclosure Bulletin, T. G. Stehney, Passivation of Alloy Junctions, vol. 5, No. 8, January 1963.

JAMES W. LAWRENCE, Primary Examiner

R. F. POLISSACK, Assistant Examiner

U.S. Cl. X.R.

148—33.1, 33.5, 33.3, 177, 185, 187; 317—235; 331—78